(12) United States Patent
Kitahara et al.

(10) Patent No.: US 6,549,404 B1
(45) Date of Patent: Apr. 15, 2003

(54) SEMICONDUCTOR MODULE APPARATUS AND COOLING APPARATUS

(75) Inventors: Takashi Kitahara, Matsuda-machi (JP); Naoki Shuto, Machida (JP)

(73) Assignee: PFU Limited, Ishikawa (JP)

( * ) Notice: Subject to any disclaimer, the term of this patent is extended or adjusted under 35 U.S.C. 154(b) by 0 days.

(21) Appl. No.: 09/762,939

(22) PCT Filed: Jun. 15, 2000

(86) PCT No.: PCT/JP00/03894

§ 371 (c)(1),
(2), (4) Date: May 1, 2001

(30) Foreign Application Priority Data

Jun. 15, 1999 (JP) .......................................... 11/168469

(51) Int. Cl.⁷ ............................................... H05K 7/20
(52) U.S. Cl. ....................... 361/695; 361/687; 361/692; 257/719; 165/121
(58) Field of Search ................................ 361/687, 688, 361/690, 692, 695, 702–705, 717–719, 735, 741, 752, 756, 760, 764, 767, 768, 789, 785, 790, 802, 816, 818; 257/760–727; 165/80.3, 80.4, 185, 121, 122, 104.33, 104.34, 120; 174/52.4, 163, 252, 254, 260, 15.1; 29/739, 740, 845; 310/62, 63, 67 R; 454/184; 415/211.1, 213.1, 214.1, 175–178, 223; 417/423.7, 423.14

(56) References Cited

U.S. PATENT DOCUMENTS

| 4,103,737 | A | | 8/1978 | Perkins | |
|---|---|---|---|---|---|
| 5,740,013 | A | | 4/1998 | Roesner et al. | |
| 5,838,066 | A | * | 11/1998 | Kitajo | 257/722 |
| 5,917,697 | A | | 6/1999 | Wang | |
| 5,940,269 | A | * | 8/1999 | Ko et al. | 361/697 |
| 6,151,214 | A | * | 11/2000 | Yeh | 361/695 |
| 6,243,263 | B1 | * | 6/2001 | Kitahara | 361/695 |
| 6,348,748 | B1 | * | 2/2002 | Yamamoto | 310/62 |

FOREIGN PATENT DOCUMENTS

| JP | 408263618 A | * | 10/1996 | ......... G06K/19/077 |
|---|---|---|---|---|
| JP | 8-321569 | | 12/1996 | |
| JP | 10-335860 | | 12/1998 | |
| JP | 11-87961 | | 3/1999 | |

* cited by examiner

Primary Examiner—Darren Schuberg
Assistant Examiner—Michael Datskovsky (57) ABSTRACT

A semiconductor module apparatus is configured such that the upper surface of a substrate on which are mounted a plurality of heat-generating semiconductor devices is covered with a radiation plate serving as a support frame for supporting the substrate. A plurality of radiation fins are protruding from the radiation plate. A cover plate is fixedly attached to the radiation plate in such a manner as to cover the radiation plate from above so as to define an air channel for cooling air therebetween. A cooling fan unit is fixedly disposed within the air channel.

14 Claims, 13 Drawing Sheets

FIG. 13

SEMICONDUCTOR MODULE APPARATUS AND COOLING APPARATUS

TECHNICAL FIELD

The present invention relates to a semiconductor module apparatus and a cooling apparatus. More particularly, the invention relates to a semiconductor module apparatus and a cooling apparatus exhibiting high cooling efficiency and being capable of assuming low mounting height.

BACKGROUND ART

Figure 12:
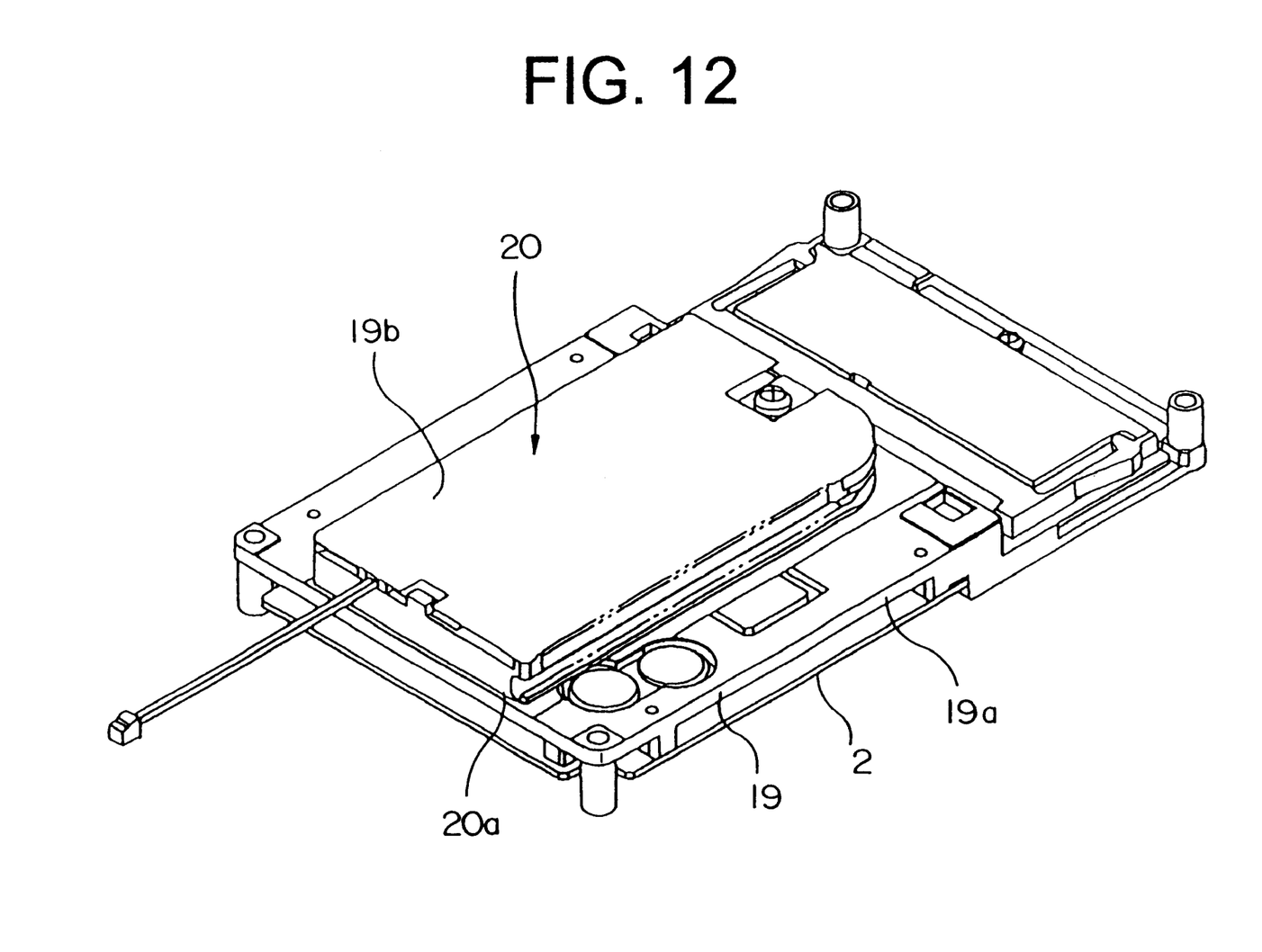
FIG. 12 is a perspective view showing a conventional semiconductor module apparatus.
Figure 13:
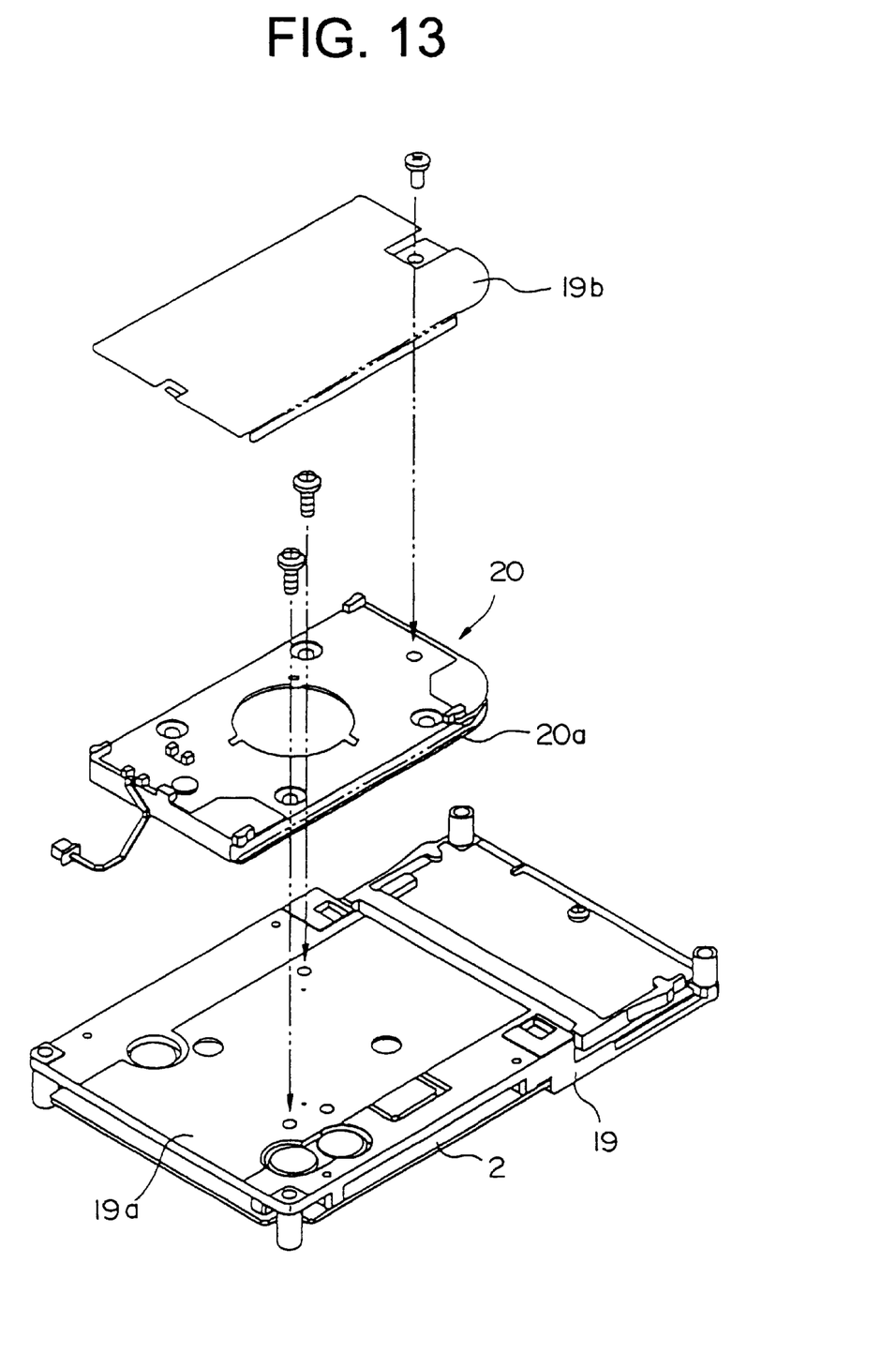
FIG. 13 is an exploded perspective view of FIG. 12.

A conventional semiconductor module apparatus is shown in FIGS. 12 and 13. The conventional semiconductor module apparatus is configured such that a plurality of semiconductor devices are mounted on a substrate 2, which is supported by a frame 19. The frame 19 is made of material of good thermal conductivity, such as aluminum, and includes a cover portion 19a which covers a region for mounting the semiconductor devices. A fan assembly 20 supporting an unillustrated miniature cooling fan unit 7 is fixedly attached to the upper surface of the cover portion 19a. Heat generated from the semiconductor devices is transmitted to the cover portion 19a serving as a heat spreader and is then radiated through cooling by the fan assembly 20. In FIGS. 12 and 13, reference numeral 19b denotes a cover member for defining an air channel for cooling air above the upper surface of the fan assembly 20.

However, the above-mentioned conventional semiconductor module apparatus involves the following drawbacks. Specifically, the above-mentioned conventional semiconductor module apparatus is configured such that the fan assembly 20 is placed on the cover portion 19a, resulting in increased mounting height. Further, heat generated from the semiconductor devices is transmitted to the cover portion 19a and then to a base plate 20a of the fan assembly 20 so as to be radiated. Thus, high thermal resistance is involved at a contact portion between the cover portion 19a and the base plate 20a, resulting in poor cooling efficiency.

The present invention has been accomplished to remedy the above-mentioned drawbacks, and an object of the invention is to provide a semiconductor module apparatus exhibiting high cooling efficiency and being capable of assuming low mounting height.

Another object of the present invention is to provide a cooling apparatus exhibiting high cooling efficiency and being capable of assuming low mounting height when mounted on a semiconductor module.

DISCLOSURE OF THE INVENTION

A semiconductor module apparatus according to one aspect of the present invention comprises a substrate having a plurality of semiconductor devices which are mounted on the substrate and generate heat; a radiation plate covering an upper surface of the substrate and serving as a support frame for supporting the substrate; a plurality of radiation fins protruding from the heat radiation plate; a cover plate fixedly attached to the radiation plate and covering the radiation plate from above, wherein the cover plate and the radiation plate define an air channel for cooling air therebetween; and a cooling fan unit fixedly disposed within the air channel.

In the semiconductor module apparatus of the present invention, heat generated from the semiconductor devices is transmitted to the radiation plate and is then radiated from the radiation fins provided on the radiation plate. Since an interface serving as a mechanical joint is not present in the heat transmission route, thermal resistance involved can be lowered, thereby improving cooling efficiency. Since the cooling fan unit is disposed within the air channel to thereby substantially integrate the cover plate and the radiation fins, the height of the semiconductor module apparatus can be lowered, thereby achieving a low mounting height of the semiconductor module apparatus.

A semiconductor module apparatus according to another aspect of the present invention comprises a substrate having a plurality of semiconductor devices which are mounted on the substrate and generate heat; a radiation plate covering an upper surface of the substrate and serving as a support frame for supporting the substrate; and a plurality of radiation fins protruding from the heat radiation plate. The radiation plate has a heat pipe reception groove formed on a radiation-fin protrusion surface and a fixture portion for fixing a cooling fan unit.

The semiconductor module apparatus of the present invention enables a user to select appropriate cooling means according to circumstances, such as the capacity of a power source. Specifically, the cooling fan unit is fixedly attached to the fixture portion, thereby effecting cooling. Alternatively, without use of the cooling fan unit (the cooling fan unit is removed), a heat pipe is fitted into the heat pipe reception groove. Thus, the flexibility of cooling design can be improved.

A cooling apparatus of the present invention comprises a radiation plate having a fixture block to be fixedly attached to a semiconductor device which generates heat and having a plurality of long and short radiation fins protruding therefrom; a cover plate fixedly attached to the radiation plate and covering the radiation plate from above, wherein the cover plate and radiation plate define an air channel for cooling air therebetween; and a cooling fan unit fixedly disposed within the air channel. The long radiation fins extend through and protrude upward from the cover plate.

According to the cooling apparatus of the present invention, the long radiation fins, which extend through and protrude upward from the cover plate, are cooled directly, thereby improving cooling efficiency. Also, even when the semiconductor module apparatus is disposed such that the upper surface thereof is in close contact with a wall or the like, a space for air intake can be maintained between the cover plate and the tip ends of the radiation fins, thereby preventing impairment in cooling efficiency.

BRIEF DESCRIPTION OF THE DRAWINGS

FIGS. 9(A) to 9(D) are views showing the attachment orientations of the cover plate;

FIG. 11 shows another embodiment of the present invention, wherein

BEST MODE FOR CARRYING OUT THE INVENTION

A semiconductor module apparatus of the present invention will be schematically described with reference to FIGS. 1 to 11.

Figure 1:
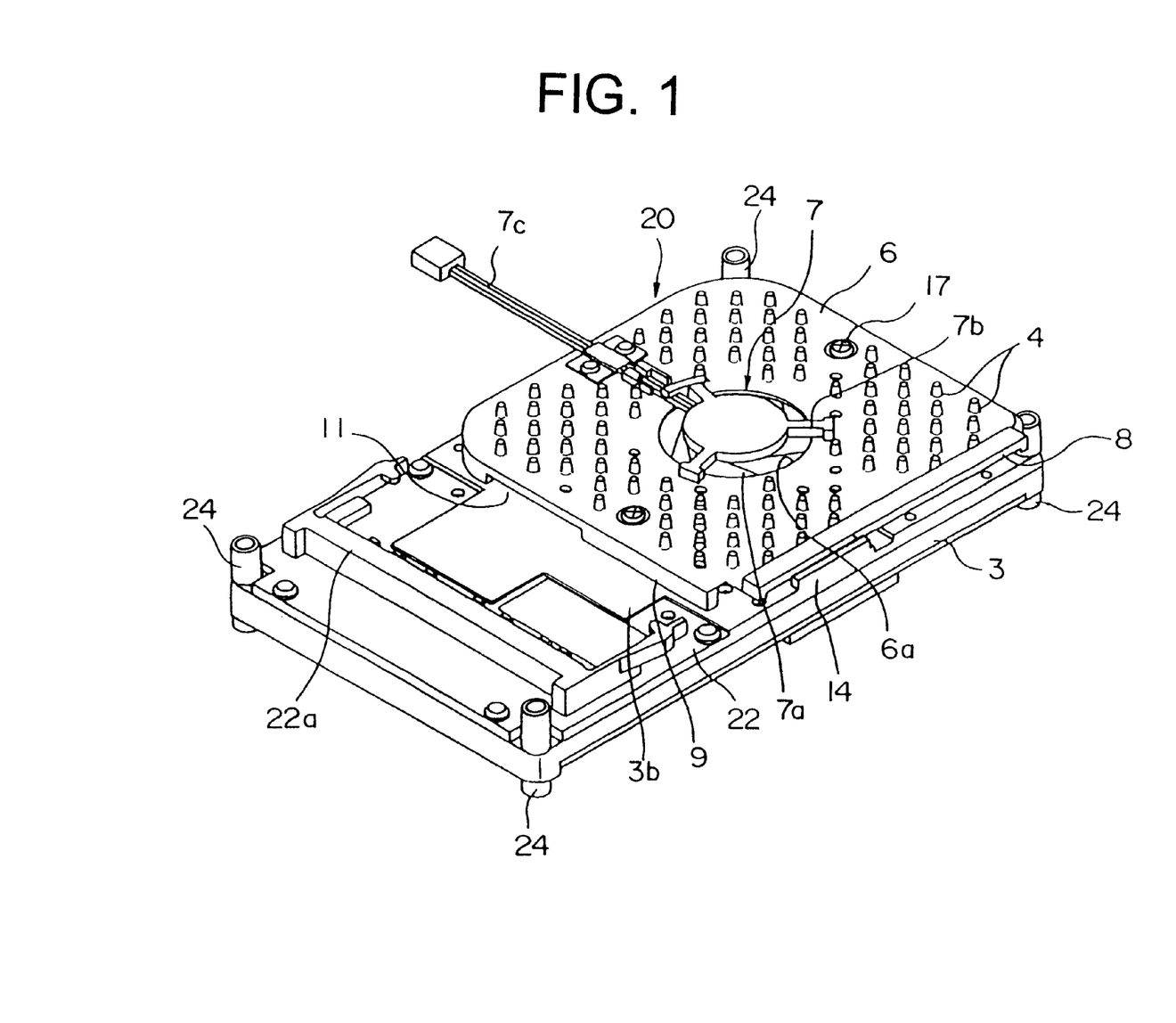
FIG. 1 is a perspective view showing a semiconductor module apparatus of the present invention.
Figure 2:
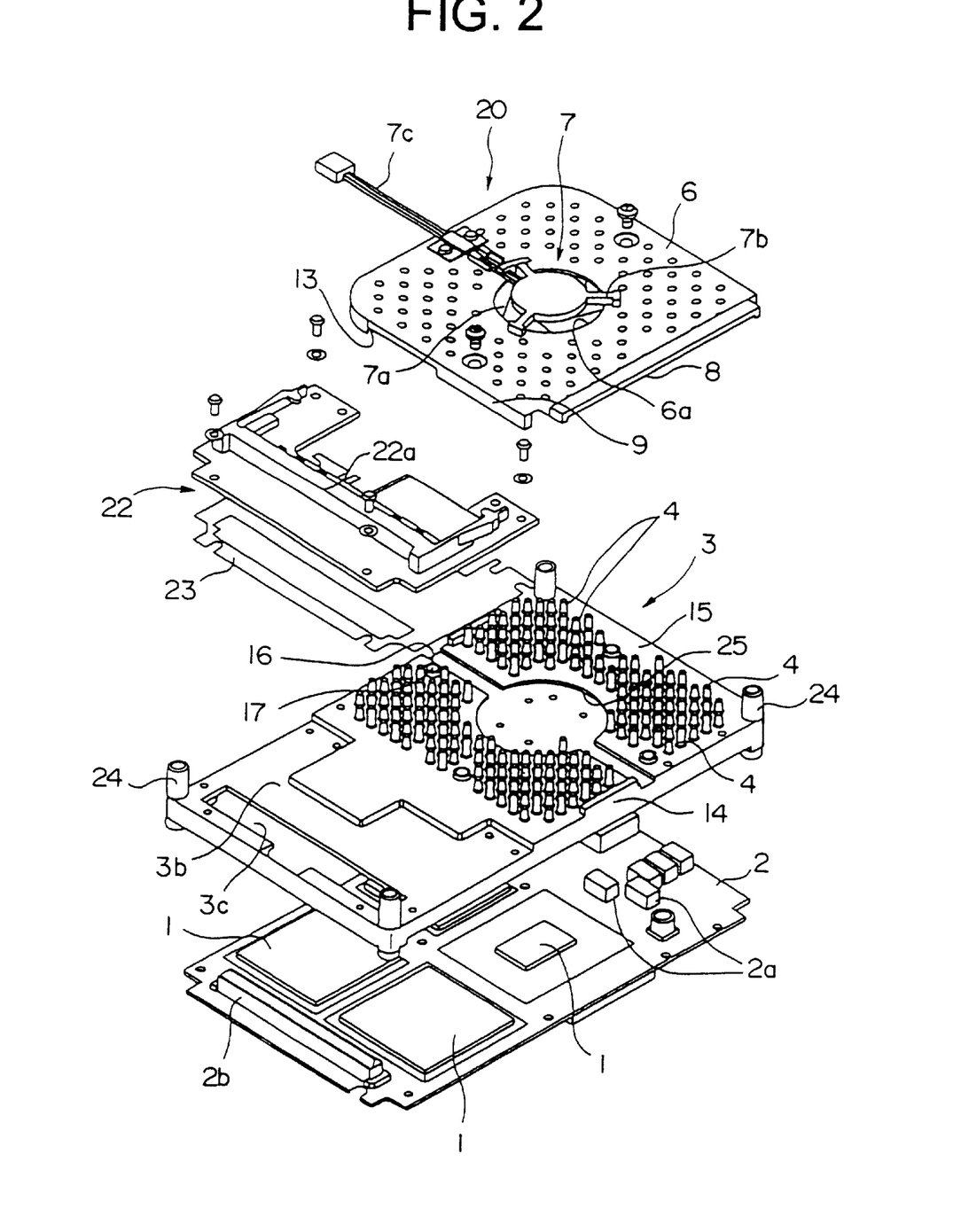
FIG. 2 is an exploded perspective view of FIG. 1.

As shown in FIGS. 1 and 2, the semiconductor module apparatus of the present invention is configured such that a radiation plate 3 serving as a support frame for supporting a substrate 2 covers the upper surface of the substrate 2, on which are mounted a plurality of semiconductor devices 1 which generate heat. A plurality of radiation fins 4 are protruding from the radiation plate 3. A cover plate 6 is fixedly attached to the radiation plate 3 in such a manner as to cover the radiation plate 3 from above so as to define an air channel 5 for cooling air therebetween. A cooling fan unit 7 is fixedly disposed within the air channel 5.

In the present invention, heat generated from the semiconductor devices 1 mounted on the substrate 2 is transmitted to the radiation plate 3 serving as a support frame for supporting the substrate 2 and is then radiated from the radiation fins 4 provided on the radiation plate 3. Since an interface serving as a mechanical joint is not present in the heat transmission route, thermal resistance involved is lowered, thereby improving cooling efficiency. Since the cooling fan unit 7 is disposed within the air channel 5, the height of the semiconductor module apparatus becomes low, thereby achieving a low mounting height of the semiconductor module apparatus.

The cooling fan unit 7 can be fixedly attached to the radiation plate 3 or, as shown in FIGS. 1 and 2, can be fixedly attached to the cover plate 6. When the cooling fan unit 7 is fixedly attached to the cover plate 6, the cooling fan unit 7; particularly, a bearing portion thereof, can be prevented from thermally deteriorating. The cooling fan unit 7 is not particularly limited. A centrifugal fan shown in FIGS. 1 and 2 which takes in cooling air from above and discharges horizontally is most suited to the semiconductor module apparatus according to the present invention for assuming a thin, broad structure. Generally, the cooling fan unit 7 is characterized in that a reduction in air flow rate is smaller in the case where a blocking wall is located on the discharge side thereof than in the case where a blocking wall is located on the suction side thereof. Accordingly, the cooling fan unit 7 is preferably arranged such that the discharge side thereof faces the interior of the air channel 5, as shown in FIGS. 1 and 2.

The radiation fins 4 may assume any appropriate shape. As shown in FIG. 2, the radiation fins 4 assume the form of a pin. Preferably, as shown in FIGS. 3, 4, 8, 10, and 11, some of the radiation fins 4 are formed longer than the remaining radiation fins 4 in such a manner as to extend through and to protrude upward from the cover plate 6. This enables heat radiation through utilization of the inflow of air into the air channel 5. Preferably, not all of the radiation fins 4 protrude upward from the cover plate 6. This prevents an unnecessary increase in pressure loss of the inflow of air, thereby preventing an impairment in suction performance of the cooling fan unit 7.

Figure 6:
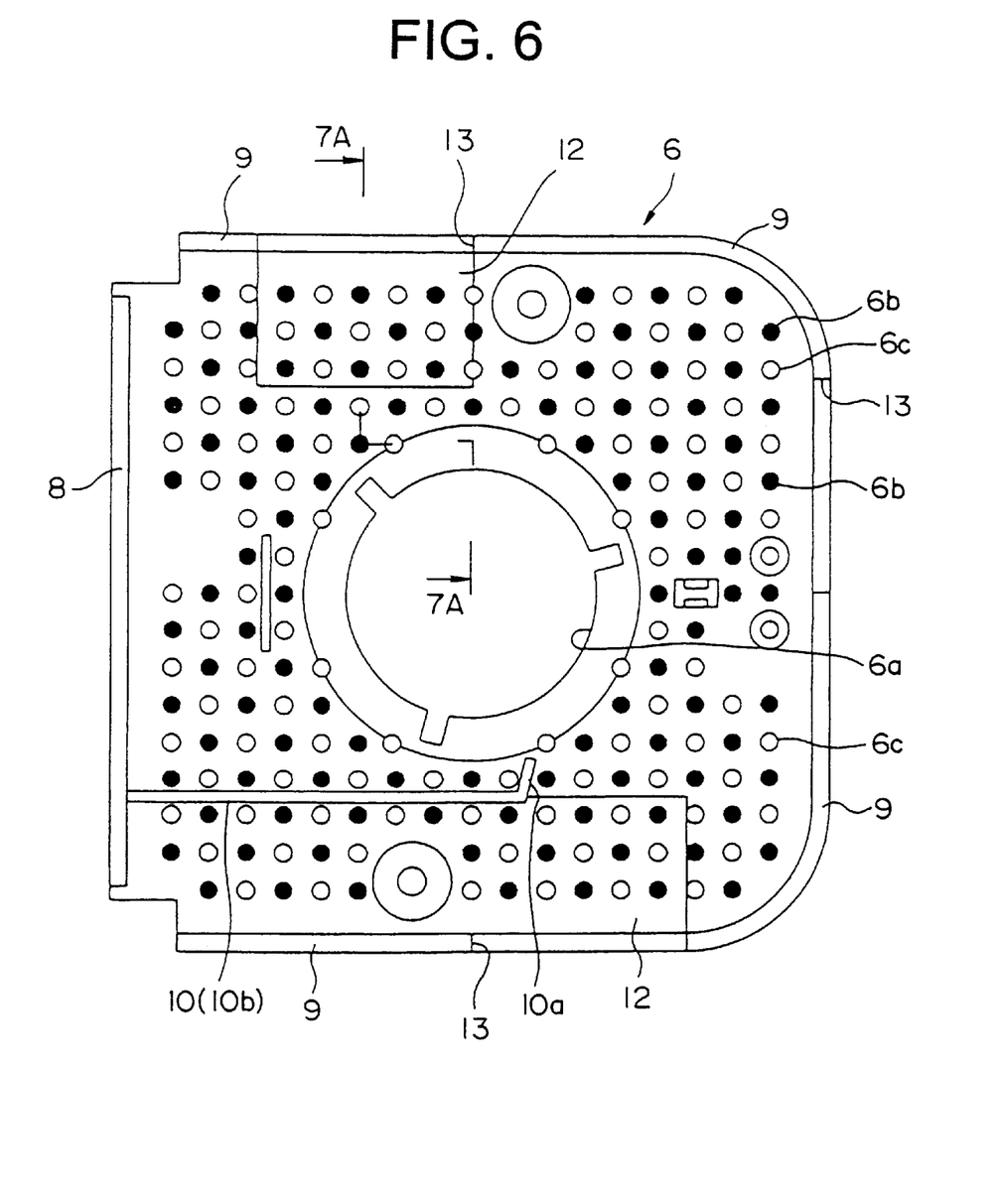
FIG. 6 is a bottom view of the cover plate.

Preferably, as shown in FIGS. 2 and 6, the cover plate 6 is provided with shield vertical walls 9 for restricting the direction of discharge of the cooling air. Through employment of the shield vertical walls 9, the orientation of an exhaust port of the air channel 5; i.e., the direction of discharge of the cooling air, can be changed through change in the attachment orientation of the cover plate 6. The configuration which enables changing the discharge direction is preferred. Ideally, the semiconductor module apparatus is mounted on an apparatus at the position where exhaust from the apparatus is discharged directly to the exterior of the housing of the apparatus. However, when an obstacle to exhaust, such as a component or a wall, is located in the vicinity of the exhaust port with a potential impairment in exhaust capability, the direction of exhaust can be easily changed, thereby improving flexibility in mounting position as well as convenience in terms of use.

Figure 7:
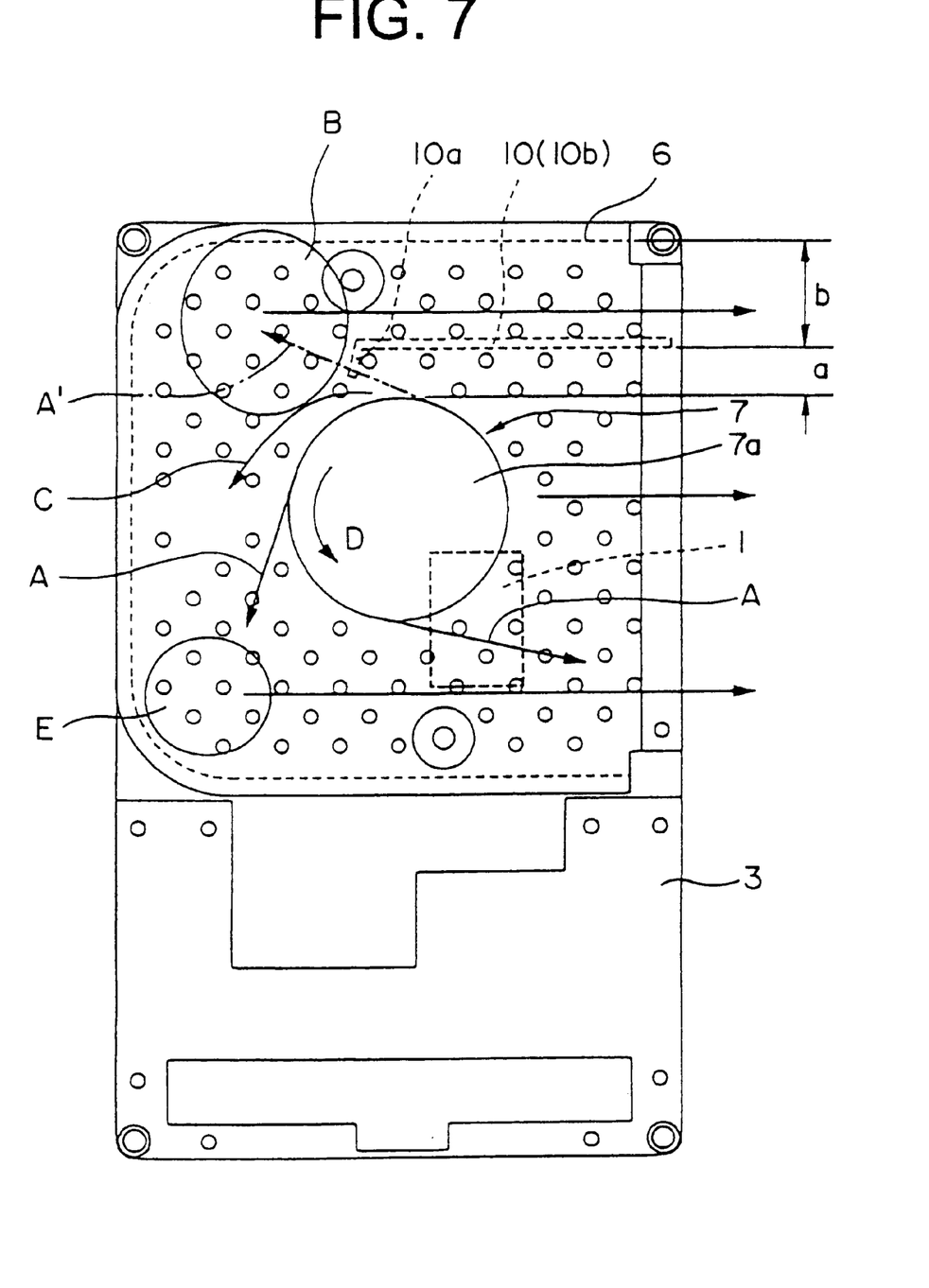
FIG. 7 is a view showing the action of a baffle.

In this case, preferably, the cooling fan unit 7 is located at the center of the air channel 5, and as shown in FIGS. 6 and 7 a baffle 10 is provided on the back surface of the cover plate 6. Thus, regardless of attachment orientation of the cover plate 6, the cooling air can be directed to the direction of discharge, thereby minimizing the difference in cooling effect among attachment orientations. As shown in FIG. 7, the baffle 10 extends along the direction of exhaust from a position located in the vicinity of a corner portion of the cover plate 6 (region B in FIG. 7) where the direction of exhaust intersects, at an acute angle, a tangent A which touches a circle defined by rotary vanes 7a of the cooling fan unit 7. Thus, the baffle 10 prevents the collision at the corner portion between an exhaust flow and the cooling air transmitted from the rotary fan unit 7. Furthermore, as represented by the arrow C of FIG. 7, the cooling air can be directed toward a side edge along which the baffle 10 is not directed. Such an arrangement prevents an impairment in overall cooling efficiency which would otherwise result from collision of cooling air, and enables preferential cooling of the semiconductor devices 1 which generates heat and are located in a region other than that located in the vicinity of a side edge corresponding to the baffle 10.

Preferably, as shown in FIGS. 3, 5 to 7, and 9, the cover plate 6 assumes the form of a square whose side has a length equal to that of a short side of the rectangular radiation plate 3, and are fixedly attached to the radiation plate 3 such that three side edges are aligned with those of the radiation plate 3. Through employment of this configuration, the area of a cooling-air-channel forming region 3a of the radiation plate 3 can be made wide and constant to a possible extent, even when the attachment orientation of the cover plate 6 is changed, thereby minimizing the variation in cooling effect caused by changing of attachment orientation. Furthermore, preferably, the cover plate 6 is configured such that the cooling air is discharged toward a central portion of the radiation plate 3 through an auxiliary discharge cut 13 formed therein, thereby enabling additional discharge of the cooling air to a region other than the cooling-air-channel forming region 3a. Thus, the semiconductor devices 1 located just under the region can be cooled efficiently.

Figure 8:
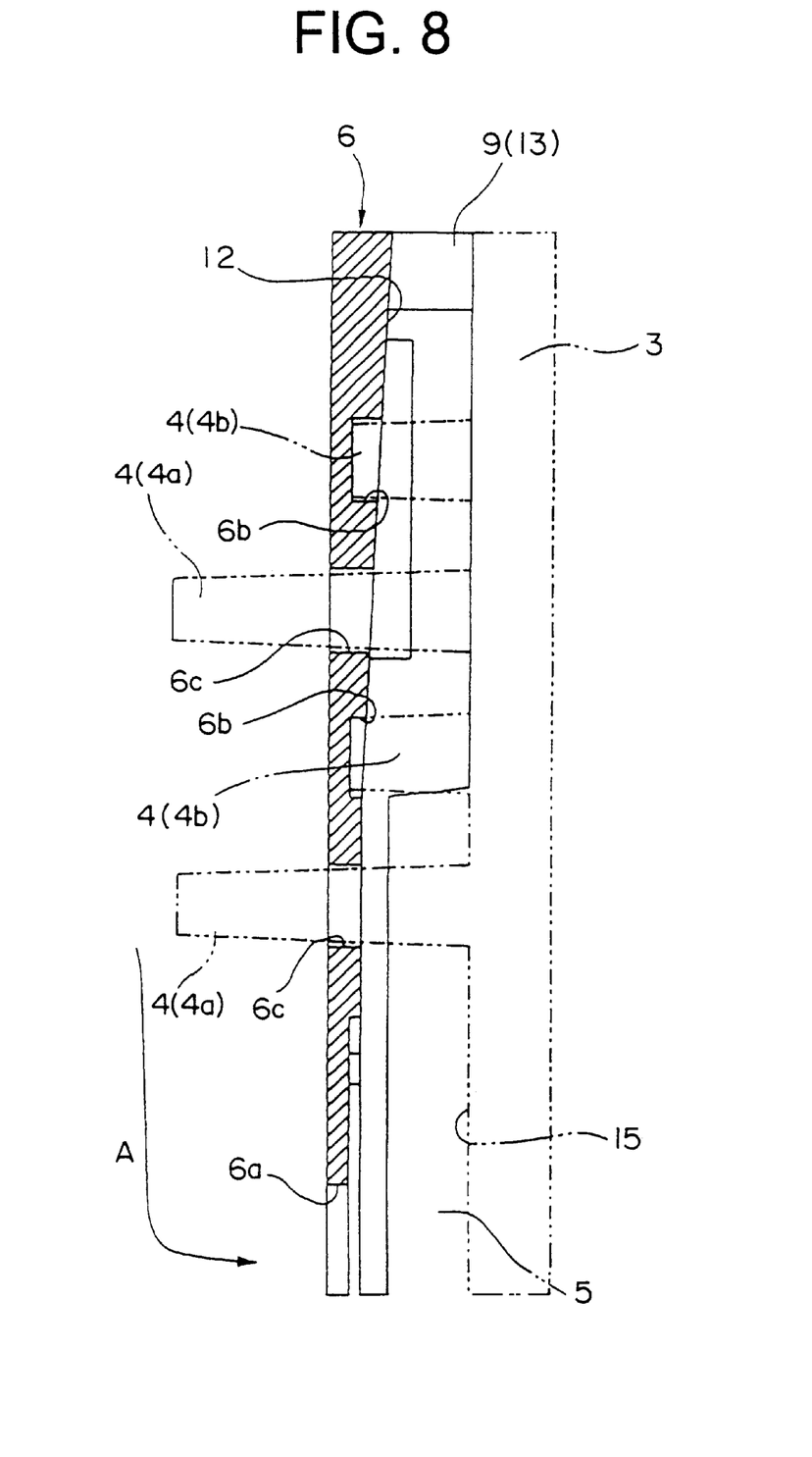
FIG. 8 is a sectional view taken along line 7A—7A of FIG. 6.

In this case, preferably, as shown in FIG. 8, a ceiling portion of the cover plate 6 located in the vicinity of an auxiliary discharge port 11 assumes the form of a sloped surface 12 such that the distance between the ceiling portion and the radiation plate 3 decreases gradually toward a corresponding side edge. The sloped surface 12 throttles a cooling air flow in the vicinity of the auxiliary discharge port 11, thereby causing an increase in air velocity. Thus, there can be improved to a possible degree the cooling efficiency at a region corresponding to the central portion of the radiation plate 3, which would otherwise becomes inferior as compared with that at the cooling-air-channel forming region 3a.

Figure 9:
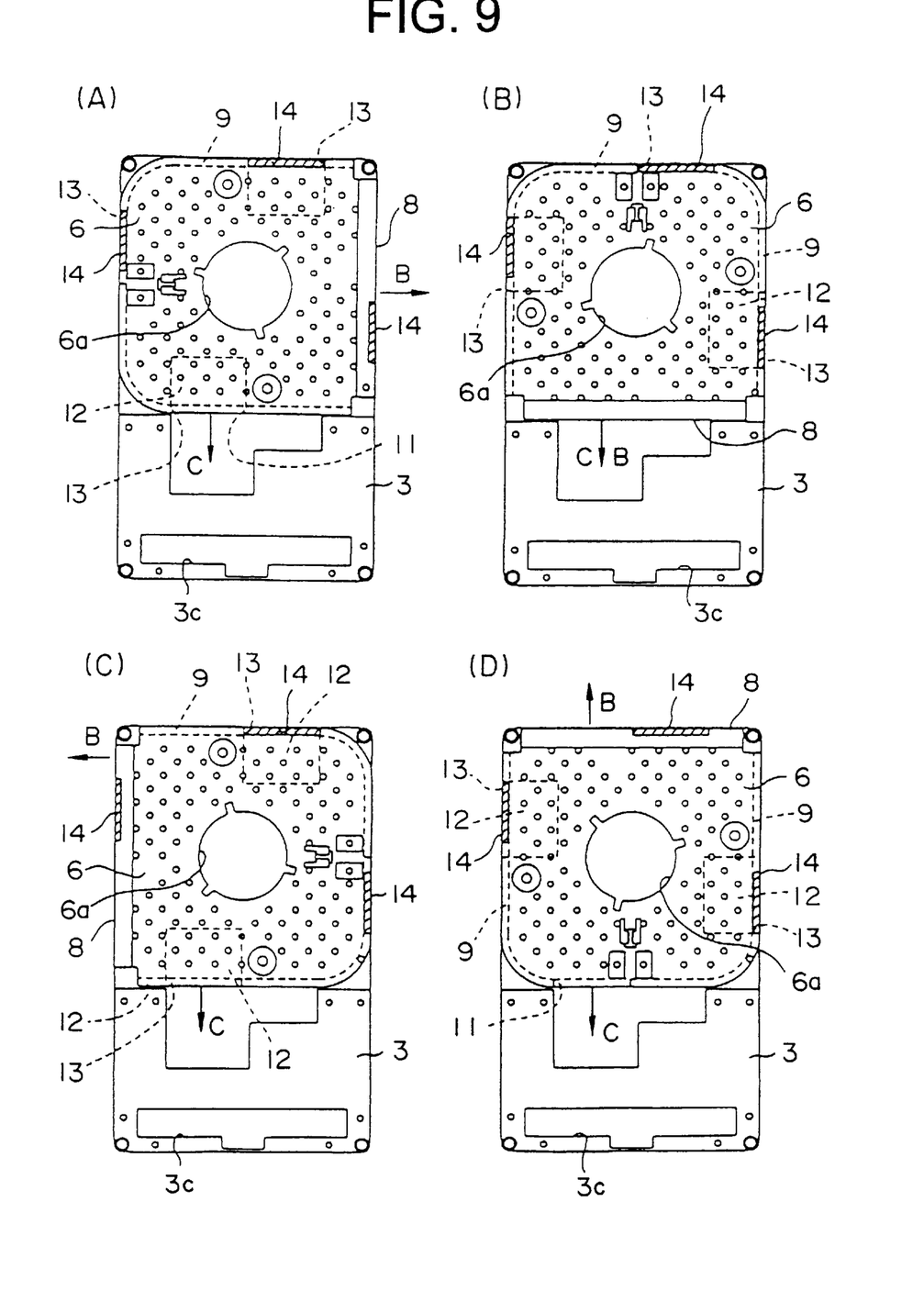

Preferably, as shown in FIGS. 6 and 9, the cover plate 6 has the auxiliary discharge cut 13 formed on each of side edges other than an open side for exhaust 8, and the radiation plate 3 is provided at three sides with blocking walls 14 for blocking the corresponding auxiliary discharge cuts 13. Through employment of this configuration, even when the cover plate 6 assumes any attachment orientation, only the auxiliary discharge cut 13 directed toward the central portion of the radiation plate 3 is opened to thereby form the auxiliary discharge port 11, whereas the other auxiliary discharge cuts 13 are blocked by the corresponding blocking walls 14. As a result, the number of discharge ports through which the cooling air is discharged from the air channel 5 does not uselessly increase, thereby preventing impairment in cooling efficiency at the cooling-air-channel forming region 3a.

Figure 10:
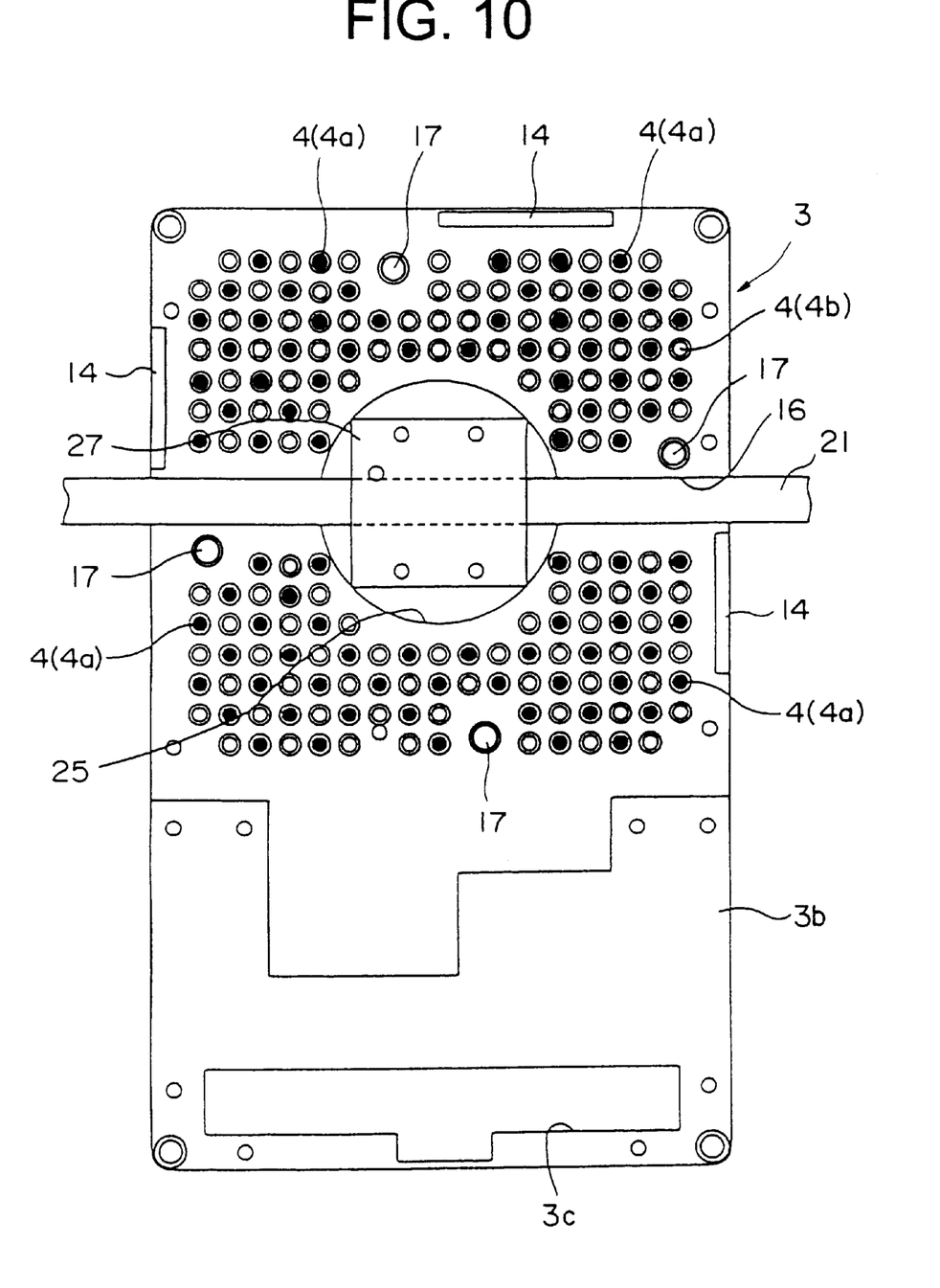
FIG. 10 is a view showing a heat pipe attached in place.

As shown in FIGS. 1 and 2, the semiconductor module apparatus of the present invention is configured such that the radiation plate 3 serving as a support frame 19 for supporting the substrate 2 covers the upper surface of the substrate 2 on which are mounted a plurality of semiconductor devices 1 which generate heat. The radiation plate 3 is provided with a plurality of radiation fins 4 protruding therefrom. As shown in FIG. 10 (and in FIG. 3), a heat pipe reception groove 16 is formed on a radiation-fin protrusion surface 15 of the radiation plate 3. Fixture portions 17 for fixing the cooling fan unit 7 in place are formed on the radiation plate 3.

This semiconductor module apparatus provides the following options for selection according to circumstances, such as the capacity of a power source: the cooling fan unit 7 is removed, and a heat pipe 21 is fixedly attached into the heat pipe reception groove 16 formed on the upper surface of the radiation plate 3; alternatively, the heat pipe 21 is removed, and the cooling fan unit 7 is fixedly attached to the semiconductor module apparatus. Thus, the flexibility of the design of a cooling apparatus can be improved.

Figure 11:
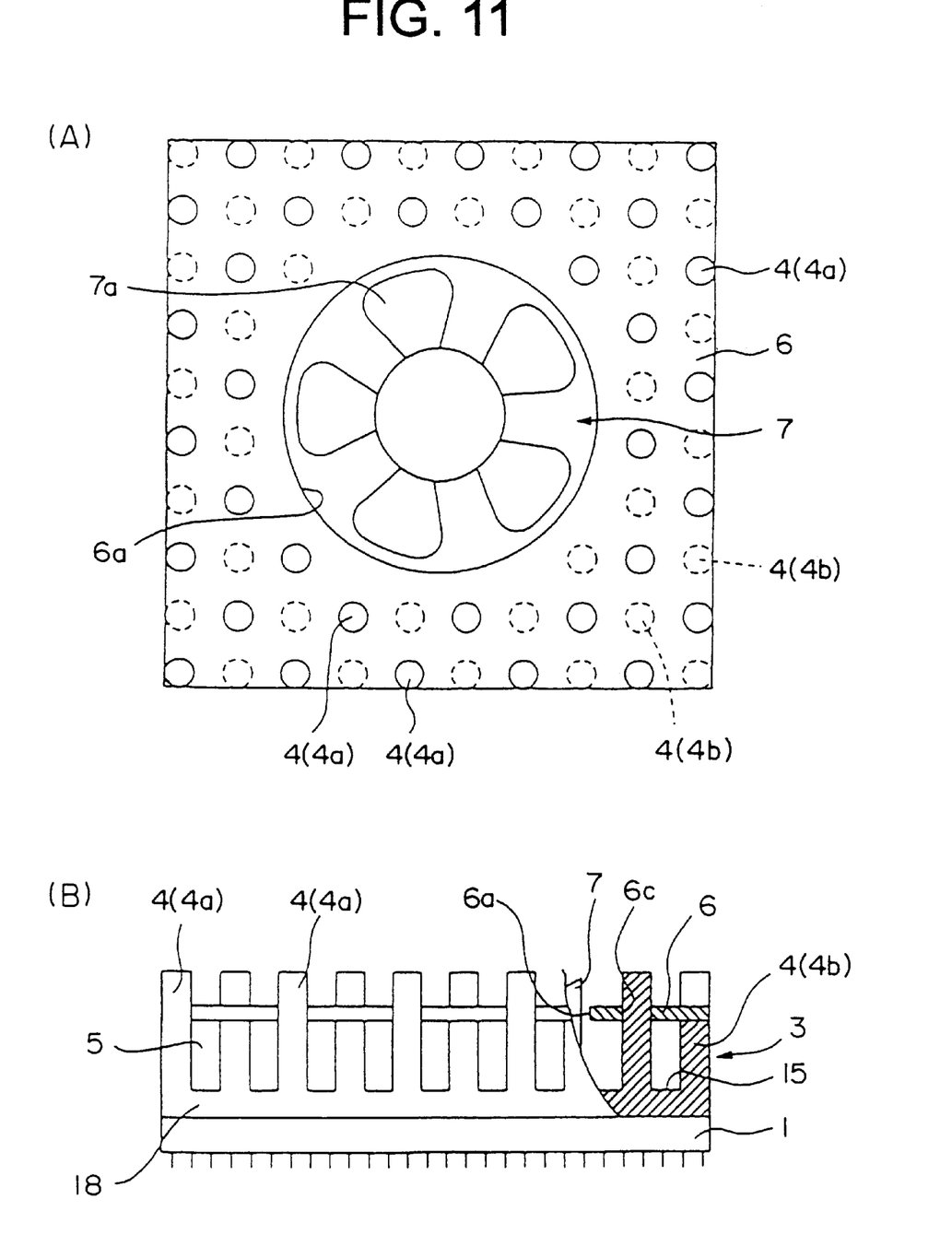
FIG. 11(A) is a plan view of a cooling apparatus.
FIG. 11(B) is a partially sectioned side view of the cooling apparatus shown in FIG. 11(A)

In the above-described semiconductor module apparatus, the cooling apparatus includes the cooling fan unit 7 and the radiation plate 3 serving as a support frame for supporting the substrate 2. Furthermore, the cooling apparatus of the present invention can be configured as shown in FIG. 11. Specifically, the cooling apparatus comprises a radiation plate 3 which in turn comprises a fixture block 18 to be fixedly attached to a semiconductor device 1 which generates heat, and having a plurality of long and short radiation fins 4 protruding therefrom; a cover plate 6 fixedly attached to the radiation plate 3 in such a manner as to cover the radiation plate 3 from above so as to define an air channel 5 for cooling air therebetween; and a cooling fan unit 7 fixedly disposed within the air channel 5. Long radiation fins 4a extend through and protrude upward from the cover plate 6.

This cooling apparatus is effectively used for cooling a plurality of semiconductor devices 1 which generate heat or for cooling a certain single semiconductor device 1 which generates heat. Since the long radiation fins 4a, which extend through and protrude upward from the cover plate 6, are cooled by intake air flow, cooling efficiency is improved. As described above, since an increase in pressure loss on the air intake side causes a greater impairment in cooling efficiency of the cooling fan unit 7 than does an increase in pressure loss on the exhaust side. Thus, the number of the radiation fins 4a, which cause pressure loss, is rendered larger in the interior of the air channel 5 than on the air intake side; i.e., than on the upper surface of the cover plate 6, thereby enabling efficient operation of the cooling fan unit 7. Preferably, the long radiation fins 4a protrude from the cover plate 6, thereby reliably maintaining a space for air intake between the cover plate 6 and the tip ends of the radiation fins 4a even when the semiconductor module apparatus is disposed such that the upper surface thereof is in close contact with a wall or the like.

Referring back to FIGS. 1 and 2, the semiconductor module apparatus according to the embodiment of the present invention is configured as a card processor having a size of about 3 inches×5 inches. That is, a CPU (Central Processing Unit) and its peripheral circuit are mounted on the substrate 2 to thereby support an external PCI (Peripheral Component Interconnect) bus. When the card processor is connected to a certain apparatus, the card processor functions as a control unit of the apparatus.

The semiconductor module apparatus includes the substrate 2, on which are surface mounted the semiconductor devices 1, such as a CPU, a CMPC(CPU, Memory and PCI bus Controller), a VGA (Video Graphic Accelerator), and a video chip set, which generate heat, and passive components 2a; and the radiation plate 3. The semiconductor module apparatus is connected to the apparatus to be controlled, by means of a connector (not shown) fixedly attached to the back surface of one side edge portion of the substrate 2. A connector 2b for connection to an auxiliary substrate 22 is fixedly attached to the substrate 2 on the side opposite the connector for connection to the apparatus; i.e., to the component-side surface of one side edge portion of the substrate 2. The connector 2b extends through a connector pass-through 3c provided in a radiation portion 3b of the radiation plate 3, which will be described later, and protrudes upward from the radiation portion 3b. The auxiliary substrate 22 is fixedly attached to the radiation portion 3b in the vicinity of the connector pass-through 3c by means of screws. In the present embodiment, a card connector 22a is fixedly attached to the auxiliary substrate 22. An extension memory board, for example, is connected to the card connector 22a. In FIG. 2, an insulation sheet 23 intervenes between the auxiliary substrate 22 and a radiation panel.

The radiation plate 3 is formed from material of good thermal conductivity, such as aluminum alloy. The radiation plate 3 includes the rectangular radiation portion 3b, which covers the substantially entire surface of the substrate 2, and a frame portion 3d for supporting the substrate 2. The frame portion 3d protrudes from four side edges of the radiation portion 3b in such a manner as to be united with the substrate 2. Mounting portions 24 are provided at the corresponding four corners of the frame portion 3d. The radiation plate 3 is fixedly attached to an apparatus to be cooled, through screwing at the mounting portions 24.

Figure 3:
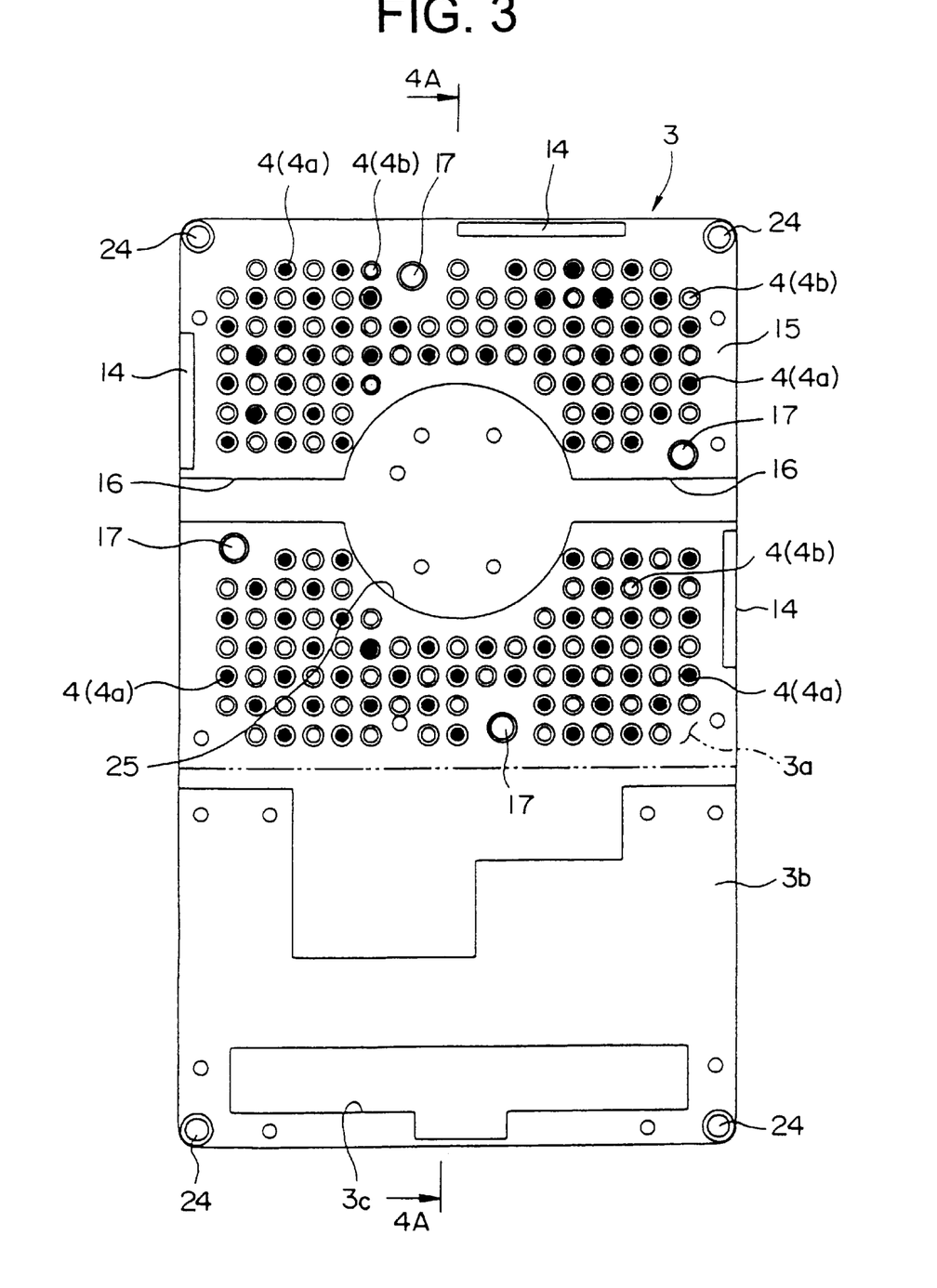
FIG. 3 is a plan view showing a radiation plate.
Figure 4:
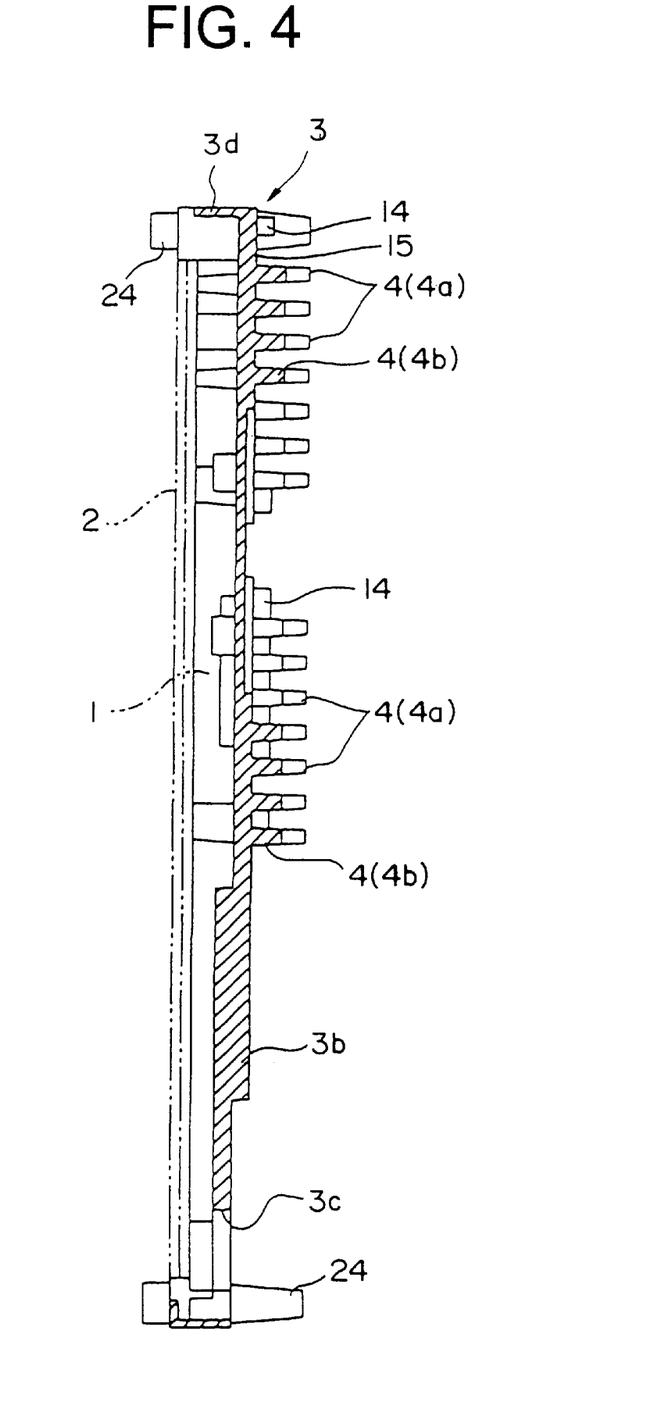
FIG. 4 is a sectional view taken along line 4A—4A of FIG. 3.

As shown in FIG. 3, the cooling-air-channel forming region 3a is established at the radiation portion 3b. The cooling-air-channel forming region 3a occupies a square region which takes as its one side a side edge of the radiation portion 3b opposite a side edge along which the connector pass-through 3c is provided. As shown in FIG. 4, the pin-shaped radiation fins 4 are arranged in the form of a matrix at the upper surface of the cooling-air-channel forming region 3a. More specifically, a plurality of radiation fins 4a and 4b, which differ in height of protrusion from a radiation-fin protrusion surface, are provided in a protruding state such that the radiation fins 4a and the radiation fins 4b are alternated in longitudinal and lateral directions. In FIG. 3, the long radiation fins 4a are represented with solid black circles, whereas the short radiation fins 4b are represented with blank circles (the same is applied to FIG. 10). These radiation fins 4a and 4b are provided in a protruding state in the cooling-air-channel forming region 3a excluding a circular fan accommodation region 25 located at the center of the cooling-air-channel forming region 3a and a strap region extending toward side edges from the fan accommodation region 25. The strap region is rendered lower in level than the radiation-fin protrusion surface 15 so as to form the heat pipe reception groove 16. The blocking walls 14 for blocking the corresponding auxiliary discharge cuts 13 of the cover plate 6, which will be described later, protrude from the corresponding side edges of the cooling-air-channel forming region 3a.

Figure 5:
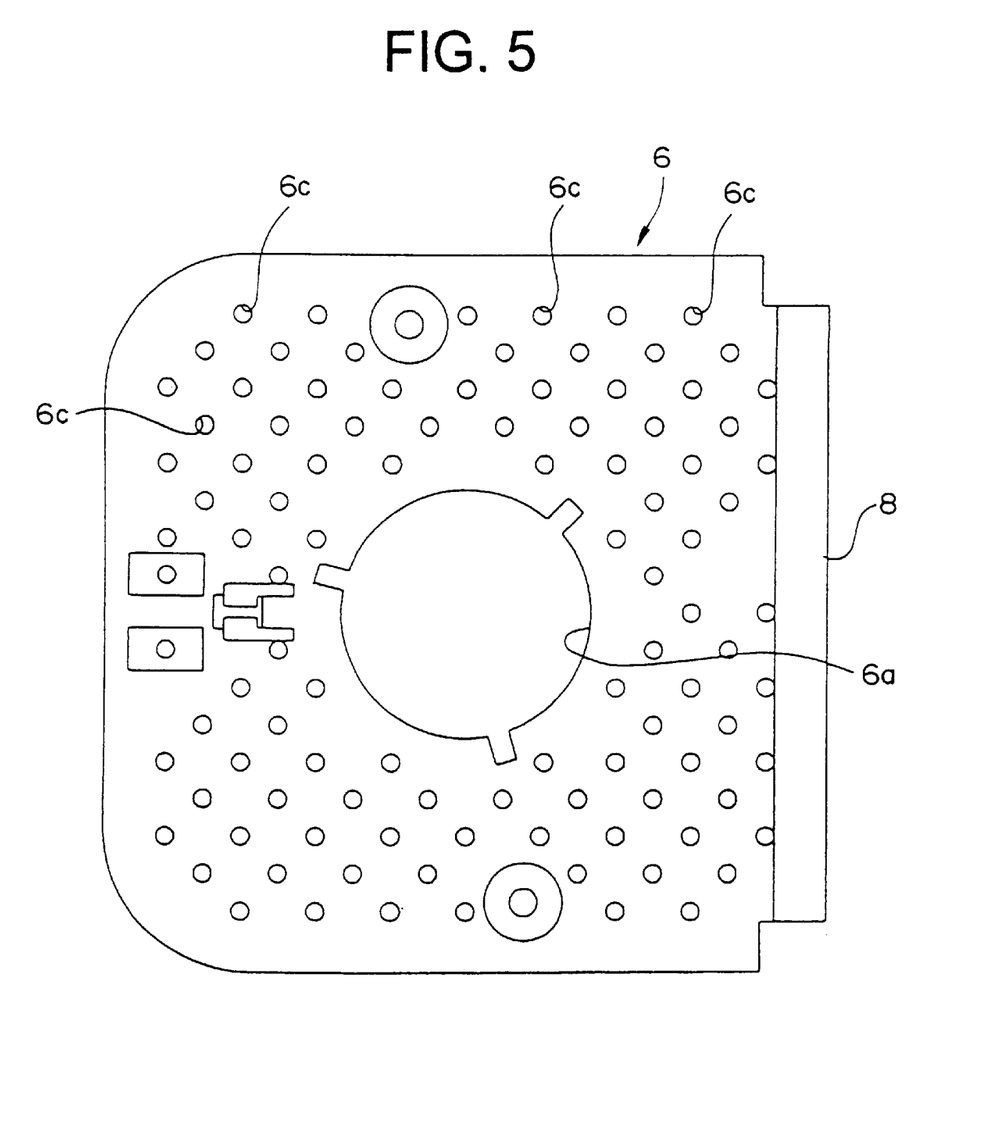
FIG. 5 is a plan view of a cover plate.

A fan assembly 20 is fixedly disposed above the cooling-air-channel forming region 3a. The fan assembly 20 is configured such that the cooling fan unit 7 is fixedly attached to the square cover plate 6, which is substantially equal in size to the cooling-air-channel forming region 3a. As shown in FIGS. 5 and 6, the cover plate 6 has a circular air intake 6a formed at its central portion; i.e., at a position located immediately above the fan accommodation region 25 of the radiation portion 3b. The rotary vanes 7a of the cooling fan unit 7 are disposed at the center of the air intake 6a (see FIGS. 1 and 2). The cooling fan unit 7 is retained by means of fan retainer legs 7b which are fixedly attached to the cover plate 6. In FIGS. 1 and 2, a harness 7c is adapted to supply electric power to the cooling fan unit 7.

The fan assembly 20 is fixedly attached to the radiation plate 3 through screwing to the fixture portions 17 of the radiation plate 3. When the fan assembly 20 is fixed in place, tip ends of the short radiation fins 4b are fitted into the corresponding fin reception recesses 6b formed on the back surface of the cover plate 6. The long radiation fins 4a extend through the corresponding fin pass-throughs 6c formed in the cover plate 6 and are exposed above the cover plate 6 (see FIG. 8). As shown in FIG. 6, the arrangement of the radiation fins 4 and the arrangement of the fin reception recesses 6b are determined such that even when the orientation of the cover plate 6 is rotationally changed in 90° units with respect to the radiation plate 3, the fin pass-throughs 6c formed in the cover plate 6 are aligned with the corresponding long radiation fins 4a, while the fin reception recesses 6b formed on the cover plate 6 are aligned with the short radiation fins 4. Notably, in FIG. 6, the fin reception recesses 6b are represented with solid black circles. When the cover plate 6 is fixed in placed, the air channel 5 is formed between the cover plate 6 and the cooling-air-channel forming region 3a, while the long and short radiation fins 4 are present in the air channel 5 in a standing condition. The rotary vanes 7a are disposed at a central portion of the air channel 5 while being surrounded by the radiation fins 4. When the cooling fan unit 7 is driven, air which is present in the vicinity of the cover plate 6 is forcibly introduced into the air channel 5 through the air intake 6a.

The shield vertical walls 9 are provided at the corresponding side edges of the cover plate 6 other than the open side for exhaust 8 in such a manner as to protrude toward the radiation plate 3. A portion of the shield vertical wall 9 is cut out so as to form the auxiliary discharge cut 13. In such a state that the cover plate 6 is fixedly attached to the radiation plate 3, the radiation-fin protrusion surface 15 of the radiation plate 3 and the open side for exhaust 8 define an exhaust port of the air channel 5. Cooling air introduced into the air channel 5 is guided by the baffle 10 formed on the back surface of the cover plate 6 and is promptly discharged from the open side for exhaust 8. The baffle 10 is adapted for use with the cooling fan unit 7 which is rotated counterclockwise (the direction of arrow D in FIG. 7). As shown in FIGS. 6 and 7, the baffle 10 includes a lead portion 10a and a parallel portion 10b. The lead portion 10 is directed in the direction of the tangent A which touches a circle defined by the rotary vanes 7a of the cooling fan unit 7. The parallel portion 10b is in parallel with a side edge of the cover plate 6 and extends toward the open side for exhaust 8. The lead portion 10a is disposed such that its starting end is located at a position which is biased toward a cooling-air collision region (region B of FIG. 7) from the rotation center of the cooling fan unit 7. Preferably, a base end of the parallel portion 10b of the baffle 10 is located 1/5 to 1/4 the diameter of a circle defined by the rotary vanes 7a away on the tangent A which touches the circle defined by the rotary vanes 7a, and is located at a position between the circle defined by the rotary vanes 7a and a side edge of the cover plate 6, the position being determined by an internally dividing ratio of 1:2 to 1:1 (a:b in FIG. 7). This positioning is intended to change the direction of the cooling air heading for the cooling-air collision region and to prevent occurrence of excessive pressure loss which would otherwise result from a reduction in the width of an air passage.

Accordingly, in the present embodiment, the baffle 10 causes the flow of cooling air A' flowing toward the baffle 10 to be curved toward a region in which is mounted a (high heat generation) semiconductor device 1 which produces a large amount of heat, such as a CPU, among the semiconductor devices 1, which generate heat. Thus, the semiconductor devices 1 of high heat generation can be cooled efficiently. Introduction of a large amount of cooling air toward the semiconductor devices 1 of high heat generation prevents stagnation of cooling air at a corner portion E, thereby improving overall cooling efficiency.

The fan assembly 20 is fixedly attached to the cooling-air-channel forming region 3a of the radiation plate 3 in such a manner as to coincide with the cooling-air-channel forming region 3a on a plane view. As shown in FIGS. 9(A) to 9(D), the fan assembly 20 enables selection from among four attachment orientations, which are established through rotation about the center of the cooling fan unit 4. The positions of the auxiliary discharge cuts 13 and the blocking walls 14 are determined such that even when the cooling fan unit 4 assumes any of the attachment orientations, only the auxiliary discharge cut 13 directed toward the central portion of the radiation plate 3 is opened, whereas the other three auxiliary discharge cuts 13 are blocked by the corresponding blocking walls 14 on the radiation plate 3. As shown in FIG. 8, a ceiling portion of the cover plate 6 located in the vicinity of each of the auxiliary discharge cuts 13 assumes the form of the sloped surface 12 such that the distance between the ceiling portion and the radiation plate 3 decreases gradually toward a side edge.

Accordingly, in the present embodiment, when the cooling fan unit 4 is driven in such a state that the fan assembly 20 is fixedly attached to the radiation plate 3, outside air is forcibly introduced into the air channel 5 through the air intake 6a as represented by arrow A of FIG. 8. Meanwhile, heat generated from the semiconductor devices 1 of high heat generation mounted on the substrate 2 is transmitted to the radiation plate 3 and is then immediately released from the radiation fins 4, which are present in the air channel 5 in a standing condition. As shown in FIG. 8, the outside air to be introduced into the air channel 5 from outside the cover plate 6 cools the long radiation fins 4a before introduction into the air channel 5, thereby improving overall cooling efficiency. When the direction of exhaust is to be changed according to the arrangement of components of an apparatus within which the semiconductor module apparatus is to be mounted, the fan assembly 20 is removed from the radiation plate 3. Then, the open side for exhaust 8 of the cover plate 6 is oriented in a desired direction. Since regardless of attachment orientation of the cover plate 6, the auxiliary discharge cut 13 opens upon the central portion of the radiation plate 3, the upper surface of the central portion of the radiation plate 3 is cooled by cooling air discharged through the auxiliary discharge cut 13. In FIGS. 9(A) to 9(D), arrow B represents the direction of exhaust, and arrow C represents the flow of air discharged through the auxiliary discharge cut 13. A ceiling surface associated with the auxiliary discharge port 11, which is established by means of the auxiliary discharge cut 13, is sloped in the direction of exhaust. Thus, discharged air is throttled to thereby increase in velocity, whereby cooling efficiency is improved.

The cooling fan unit 7 may be retained such that a bearing housing is embedded in the radiation plate 3. Alternatively, the fan assembly 20—which includes the cooling fan unit 7 and the cover plate 6 on which the cooling fan unit 7 is fixedly mounted—may be removed. In this case, as shown in FIG. 10, in order to enhance cooling efficiency, the heat pipe 21 is fitted into the heat pipe reception groove 16 and is fixed in place in the fan accommodation region 25. In the fan accommodation region 25, the heat pipe 21 is screwed by use of a heat pipe fixture 27 to the radiation plate 3 screwed to the substrate 2. Accordingly, the semiconductor module apparatus is configured such that the radiation plate 3 has the heat pipe reception groove 16 formed on the radiation-fin protrusion surface 15 and includes the fixture portions 17 for the cooling fan unit 7, while the heat pipe 21 is fitted into the heat pipe reception groove 16 or while the cooling fan unit 7 is accommodated in the fan accommodation region 25 and fixedly attached to the fixture portions 17.

In the above example, the radiation plate 3 assumes such a size as to cover the entire substrate 2 so as to serve also as the frame portion 3d. However, as shown in FIG. 11, the radiation plate 3 may be configured so as to serve a cooling apparatus for cooling merely a certain component on the substrate 2. In the description of the embodiment of FIG. 11, components substantially common to those of the above-described embodiment are denoted by common reference numerals, and repeated description thereof is omitted.

In the present embodiment, a cooling apparatus includes a radiation plate 3 fixedly attached to a semiconductor device 1 which generates heat; a cover plate 6 fixedly attached to the radiation plate 3 to thereby define an air channel 5 therebetween; and a cooling fan unit 7 whose bearing house (bearing portion of the cooling fan unit 7) is embedded in the radiation plate 3. The radiation plate 3 is formed from material of good thermal conductivity, such as aluminum alloy. The radiation plate 3 is configured such that a plurality of radiation fins 4 are provided in a protruding state and arranged in the form of a matrix on a fixture block 18 to be fixed to the heat-generating semiconductor device 1 by means of, for example, an adhesive (not shown) of good thermal conductivity. The radiation fins 4 of two kinds, which are long and short, are arranged on the radiation plate 3 in an alternating manner in longitudinal and lateral directions. Long radiation fins 4a protrude from the upper surface of the cover plate 6. Notably, a plurality of recesses 6b may be formed on the back surface of the cover plate 6 such that tip ends of short radiation fins 4b are fitted into the corresponding recesses 6b.

Thus, in the present embodiment, an air flow which is generated above the cover plate 6 can be utilizes for accelerating release of heat from the radiation fins 4, thereby improving cooling efficiency. The radiation fins 4a, which protrude from the cover plate 6, are fewer than the radiation fins 4 present in the air channel 5, thereby preventing occurrence of excessive pressure loss at the time of suction through an air intake opening 6a. Thus, the air intake capability of the cooling fan unit 7 is not adversely effected.

Industrial Applicability

As seen from the above description, the semiconductor module apparatus of the present invention does not involve an interface serving as a mechanical joint so as to decrease thermal resistance, thereby efficiently releasing heat from semiconductor devices which generate heat, and thus improving cooling efficiency. Since the cooling fan unit is disposed within the air channel, the height of the semiconductor module apparatus can be lowered. Thus, the semiconductor module apparatus can assume low mounting height. The semiconductor module apparatus enables a user to select appropriate cooling means according to circumstances, such as the capacity of a power source. The cooling apparatus of the present invention employs the radiation fins extending through and protruding from the cover plate, thereby enhancing cooling efficiency and thereby enabling reliable establishment of a space between the cover plate and the tip ends of the radiation fins so as to prevent potential impairment in cooling efficiency.

What is claimed is:

1. A semiconductor module apparatus comprising:
a substrate having a plurality of semiconductor devices which are mounted on the substrate and generate heat;
a radiation plate covering an upper surface of the substrate and serving as a support frame to support the substrate;
a plurality of radiation fins protruding from the heat radiation plate;
a cover plate fixedly attached to the radiation plate and covering the radiation plate from above, wherein the cover plate and the radiation plate define an air channel for cooling air therebetween; and
a cooling fan unit fixedly disposed within the air channel,
wherein each of the plurality of radiation fins has a pin form, and a part of the radiation fins are long and the remaining part of the radiation fins short, the long radiation fins extending through and protrude upward from the cover plate.

2. A semiconductor module apparatus according to claim 1,
wherein the cover plate has a plurality of recesses formed on a back surface thereof; and
wherein a tip end of each of the short radiation fins is fitted into the corresponding recess.

3. A semiconductor module apparatus according to claim 1, wherein the plurality of radiation fins are arranged in a matrix form, the long radiation fins and the short radiation fins being alternated in longitudinal and lateral directions.

4. A semiconductor module apparatus comprising:
a substrate having a plurality of semiconductor devices which are mounted on the substrate and generate heat;
a radiation plate covering an upper surface of the substrate and serving as a support frame to support the substrate;
a plurality of radiation fins protruding from the heat radiation plate;
a cover plate fixedly attached to the radiation plate and covering the radiation plate from above, wherein the cover plate and the radiation plate define an air channel for cooling air therebetween, and wherein the cover plate is attached to the radiation plate and has a shield vertical wall to limit discharge of cooling air from a side other than an open side for exhaust, orientation of the cover plate being able to be changed with respect to the radiation plate; and a cooling fan unit fixedly disposed within the air channel.

5. A semiconductor module apparatus according to claim 2, wherein the cooling fan unit is located at the center of the air channel; and wherein the cover plate has baffle provided on a back surface thereof, the baffle extending along the direction of exhaust from a position located in the vicinity of a corner portion of the cover plate where the direction of exhaust intersects, at an acute angle, a tangent which touches a circle defined by rotary vanes of the cooling fan unit.

6. A semiconductor module apparatus according to claim 4, wherein the radiation plate has the form of a rectangle;

wherein the cover plate has the form of a square and are fixedly attached to the radiation plate, three side edges of the square being aligned with those of the radiation plate, and a side of the square having a length equal to that of a short side of the radiation plate; and wherein the air channel has an auxiliary discharge port oriented toward a central portion of the radiation plate.

7. A semiconductor module apparatus according to claim 6, wherein a ceiling portion of the cover plate located in the vicinity of the auxiliary discharge port has the form of a sloped surface, a distance between the ceiling portion and the radiation plate decreasing gradually toward the side edge.

8. A semiconductor module apparatus according to claim 6, wherein the cover plate has an auxiliary discharge cut formed on each of side edges other than the open side for exhaust; and wherein the radiation plate has blocking walls at three sides thereof to block the corresponding auxiliary discharge cuts.

9. A semiconductor module apparatus comprising:

a substrate having a plurality of semiconductor devices which are mounted on the substrate and generate heat;

a radiation plate covering an upper surface of the substrate and serving as a support frame to support the substrate; and a plurality of radiation fins protruding from the heat radiation plate;

wherein the radiation plate has a heat pipe reception groove formed on a radiation-fin protrusion surface and a fixture portion to fix a cooling fan unit.

10. A semiconductor module apparatus according to claim 9, further comprising:

a heat pipe fitted into the heat pipe reception groove.

11. A semiconductor module apparatus according to claim 9, further comprising:

a cooling fan unit fixedly attached to the fixture portion.

12. A cooling apparatus comprising:

a radiation plate having a fixture block to be fixedly attached to a semiconductor device which generates heat, and having a plurality of long and short radiation fins projecting from the fixture block;

a cover plate fixedly attached to the radiation plate and covering the radiation plate from above, wherein the cover plate and the radiation plate define an air channel for cooling air therebetween; and a cooling fan unit fixedly disposed within the air channel, wherein the long radiation fins extend through and protrude upward from the cover plate.

13. A cooling apparatus according to claim 12, wherein the cover plate has a plurality of recesses formed on a back surface thereof; and wherein a tip end of each of the short radiation fins is fitted into the corresponding recess.

14. A cooling apparatus according to claim 12, wherein the plurality of radiation fins are arranged in a matrix form, the long radiation fins and the short radiation fins being alternated in longitudinal and lateral directions.

* * * * *